United States Patent [19]

Torimaru et al.

[11] Patent Number: 4,972,376

[45] Date of Patent: Nov. 20, 1990

[54] SELF-REFRESH SYSTEM FOR USE IN A FIELD MEMORY DEVICE OPERATING WITHOUT RELIANCE UPON EXTERNAL CONTROL

[75] Inventors: Yasuo Torimaru, Nara; Kouji Inoue, Osaka, both of Japan

[73] Assignee: Sharp Kabushiki Kaisha, Osaka, Japan

[21] Appl. No.: 268,499

[22] Filed: Nov. 8, 1988

[30] Foreign Application Priority Data

Nov. 9, 1987 [JP] Japan .................. 62-282732

[51] Int. Cl.$^5$ .................. G11C 13/00
[52] U.S. Cl. .................. 365/222; 365/230.03; 365/189.05; 365/230.08
[58] Field of Search .................. 365/222, 230.03, 203, 365/189.09, 230.08, 189.05

[56] References Cited

U.S. PATENT DOCUMENTS

| | | | |
|---|---|---|---|
| 4,691,303 | 9/1987 | Churchward et al. | 365/230.03 |
| 4,700,330 | 10/1987 | Altman et al. | 365/222 X |
| 4,706,221 | 11/1987 | Satoh et al. | 365/222 X |
| 4,747,082 | 5/1988 | Minato et al. | 365/222 X |
| 4,754,425 | 6/1988 | Bhadriraju | 365/222 |
| 4,783,768 | 11/1988 | Tanimura | 365/222 |
| 4,797,850 | 1/1989 | Amitai | 365/900 X |

FOREIGN PATENT DOCUMENTS 0109069 5/1984 European Pat. Off. .......... 365/222

OTHER PUBLICATIONS

*System Design/Integrated*, CRTS, Computer Design, vol. 22, Mar. 83, No. 3, pp. 111-118, "The Chip that Refreshes Itself", by Fallin et al.

*Primary Examiner*—Stuart N. Hecker
*Assistant Examiner*—Alfonso Garcia

[57] ABSTRACT

In a dynamic Random Access Memory having memory cells arranged in a matrix shape, one of row decoders is designated so that the data stored in the memory cells of a row corresponding to the designated row decoder are read out. Subsequently, a row address for refreshing the memory cell array is automatically generated by a refresh address counter which is located in the dynamic Random Access Memory, thereby, the memory cells on the row of the memory cell array are refreshed without any external refresh control unit.

4 Claims, 2 Drawing Sheets

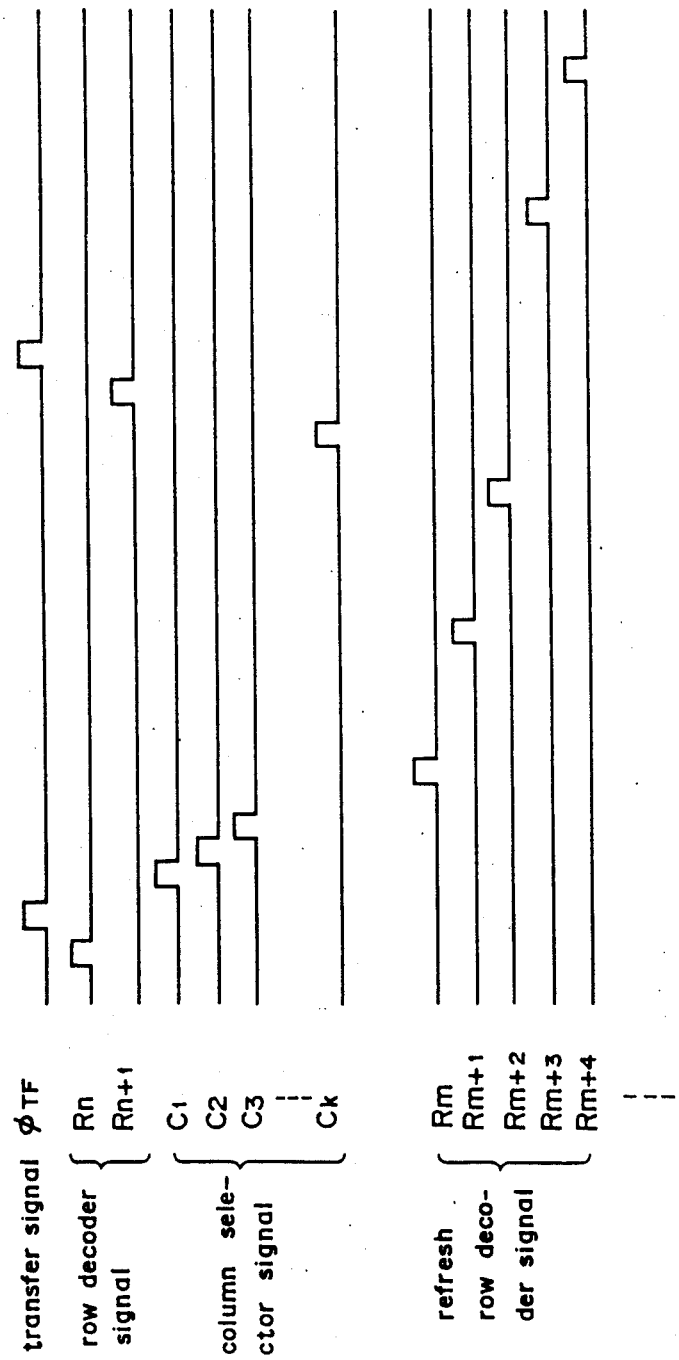

SELF-REFRESH SYSTEM FOR USE IN A FIELD MEMORY DEVICE OPERATING WITHOUT RELIANCE UPON EXTERNAL CONTROL

BACKGROUND OF THE INVENTION

1. Field of the Invention

The present invention relates to a self-refresh system for use in a dynamic random access memory (dynamic RAM or DRAM hereinafter) such as a field memory for serially reading-out and writing-in image data to form an image or picture of one field of a television system.

2. Description of the Prior Art

The field memory of the above type is different from a normal memory for storing normal data and is adapted to read and write the image in series, therefore, the field memory has such a property that each memory cell of the field memory is automatically refreshed at regular periods. The period for refreshing the memory cell array of the field memory is generally 16.6 milliseconds (ms) when using the NTSC standard television signal. On the other hand, the periods for refreshing the memory cell array of various standard dynamic RAMs such as 256 K/DRAM and 1 M/DRAM are respectively 4 ms and 8 ms, both of which are shorter than the period of 16.6 ms mentioned above; therefore, the memory cell array of such a dynamic RAM should be refreshed in any method. Generally, there is provided a refresh control unit in an external portion of a dynamic RAM so as to refresh the memory cell array thereof at a regular period.

In the conventional refresh system, there must be provided an external control unit for refreshing the memory cell array, resulting in that the design of the device employing a field memory has been complicated and the number of the parts thereof has been increased.

SUMMARY OF THE INVENTION

An object of the present invention is to provide a self-refresh system which is able to automatically refresh the contents of the memory cell array without any external control, thereby solving the problem mentioned above.

In a self-refresh system according to the present invention, one of the row decoders in a dynamic RAM having memory cells arranged in a matrix shape is designated so that the data stored in the memory cells of a row corresponding to the designated row decoder are read out. Subsequently, a row address for refreshing the memory cell array is automatically generated by a refresh address counter which is located in the dynamic RAM, whereby the memory cells on the row of the memory cell array are refreshed without any external refresh control unit.

BRIEF DESCRIPTION OF THE DRAWINGS

FIG. 2 is a timing chart showing the operation of the self-refresh system shown in FIG. 1.

DETAILED DESCRIPTION OF THE PREFERRED EMBODIMENT

Figure 1:
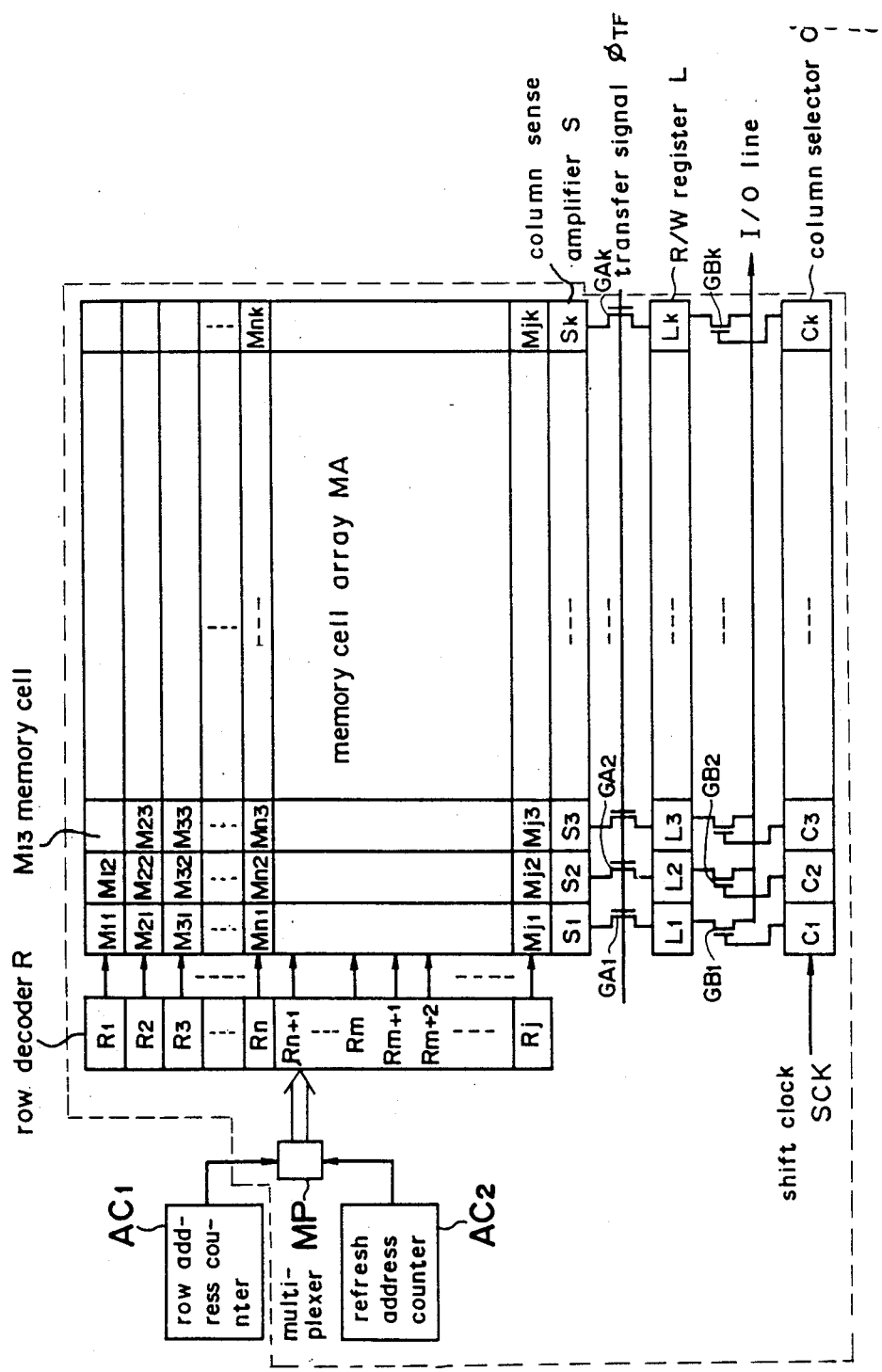
FIG. 1 is a block diagram showing an embodiment of a self-refresh system according to the present invention.

As shown in FIG. 1, there are shown a memory cell array MA of a dynamic RAM having memory cells $M_{11}, M_{12}, \ldots, M_{21}, M_{22}, \ldots, M_{jk}$ arranged in a matrix shape of j x k, a row address counter $AC_1$ for designating the address of the rows of the memory cell array MA during the period of reading or writing data, a refresh address counter $AC_2$ for designating the address of the rows of the memory cell array MA during the period of refreshing. A multiplexer MP is arranged at the output of the counters $AC_1$ and $AC_2$ so as to select either the output of the counters $AC_1$ during a read or write operation or the output of the counter $AC_2$ during a refresh operation. The output of the multiplexer MP is fed to row decoders $R_1, \ldots, R_j$ which designates the row address of the memory cell MA. All of the row decoders $R_1, R_2, \ldots, R_j$ are generally designated by R.

There are further provided column sense amplifiers $S(S_1, S_2, \ldots, S_k)$, a transfer signal $\phi_{TF}$, R/W registers $L(L_1, L_2, \ldots, L_k)$, an input/output line I/O, column selectors $C(C_1, C_2, \ldots, C_k)$ and a shift clock signal SCK. It is noted that R/W means read and write.

The operation of the self-refresh system according to the present invention will be explained with reference to FIGS. 1 and 2.

According to the contents of the row address counter $AC_1$, one row decoder $R_n$ is selected among the row decoders $R_1, R_2, \ldots, R_j$ and memory cells $M_{n1}, \ldots, M_{nk}$ on one row of the memory cell array corresponding to the decoder $R_n$ are activated among the memory cells $M_{11}, \ldots, M_{jk}$ which are arranged in two dimensions so that data previously written in the memory cells are read out through the column sense amplifiers $S_1, \ldots, S_k$. The read out data on the column sense amplifiers $S_1, \ldots, S_k$ are respectively transferred to the R/W registers $L_1, \ldots, L_k$ by the transfer signal $\phi_{TF}$ through the gates $GA_1, GA_2, \ldots, GA_k$. Subsequently, the column selectors $C_1, \ldots, C_k$ are activated in response to the shift clock signal SCK so as to turn on the column selectors in the order of $C_1, C_2, \ldots, C_k$ and then the contents of the R/W registers $L_1, \ldots, L_k$ are read out to the input/output line I/O through the gates GB1, GB2, GBk. Subsequently, the count of the row address counter $AC_1$ is incremented by one, whereby a row decoder $R_{n+1}$ is selected and the data in the memory cells $M_{(n+1)1'}, \ldots, M_{(n+1)k}$ are read out on the input/output line I/O in a similar way. In this way, the entire data stored in the memory cell array MA are provided in series to an external circuit (not shown) as the output of the input/output line I/O.

Assuming that the memory cell array MA has a capacity being capable of storing the image data corresponding to one field of the standard NTSC television signal and that the number of the row decoders is equal to the number of the scan lines of one field of the NTSC television picture and since the period of the standard NTSC signal of one field is 16.6 ms, when sampling a composite video signal with a frequency of 3 $f_{SC}$ ($f_{SC}$ is a color subcarrier frequency, being nearly equal to 3.58 MHz), the number j which is the maximum number of the row of the memory cell array MA and the number k which is the maximum number of the line of the memory cell array MA are as follows:

$j = 263$ $k = 16.6 \ ms/[(1/3f_{SC}) \times j] = 678$

In the present example, the period from the time of the access of the memory cell $M_{11}$ to the time of the access of the memory cell $M_{jk}$ is approximately 16.6 ms, which is longer than the period for refreshing the memory cell array of a standard dynamic RAM as described above, therefore, there is a fear of destruction of the contents stored in the memory cell array MA.

As shown in FIG. 2, in the self-refresh system according to the present invention, the data of the memory cell array MA is refreshed by generating refresh row decoder signals between the transfer signals $\phi_{TF}$. More specifically when addressing of one row of the memory array MA by the signal $\phi_{TF}$ is finished. For example, after the decoder $R_n$ is enabled to address the row of the memory cell array $M_{n1}$ to $M_{nk}$, the multiplexer MP is switched to the refresh address counter $AC_2$ so as to output the contents of the refresh address counter $AC_2$ so that the row decoder $R_m$ (m is not equal to n) is designated, whereby the contents of the memory cells $M_{m1}$ to $M_{mk}$ are refreshed. After the refresh of the memory cells $Mm_1$ to $M_{mk}$ is completed, the contents of the refresh address counter $AC_2$ is advanced by 1 upon receipt of a clock signal, so that the decoder $R_{m+1}$ is designated and the contents of the memory arrays $M_{(m+1)1}$ to $M_{(m+1)k}$ are refreshed. In the examples shown in FIG. 2, there are inserted three refresh addresses $R_m$, $R_{m+1}$ and $R_{m+2}$ in an interval of the transfer signals $\phi_{TF}$. When the refresh of the memory arrays $M_{(m+2)1}$, $M_{(m+2)2}$, ..., $M_{(m+2)k}$ is finished, the multiplexer MP is switched toward the address counter $AC_1$ so that the decoder $R_{n+1}$ is designated.

It is noted that the address counters $AC_1$ and $AC_2$ may be clocked at various clock signals such as clock signals $\phi_{TF}$ and/or SCK or their frequency divided signals so long as the operation mentioned above can be performed.

Similarly, in the next interval of the transfer signals $\phi_{TF}$, there are inserted three refresh addresses $R_{m+3}$, $R_{m+4}$ and $R_{m+5}$ so as to generate three refresh row decoder signals between the transfer signals. Accordingly, since three refresh cycles can be performed during one cycle of the row addressing for the read/write operation of one row of the memory cell array MA the interval of one refresh cycle of each memory cell is 16.6 ms/3=5.5 ms.

In the example shown in FIG. 1, since the number j is 263 and the number k is 678, assuming that the number of the quantization bits is 6 with the sampling $3f_{sc}$, the capacity for storing the image data of one field of the television signals is $$263 \times 678 \times 6 = 1 \ M \ bits.$$

Since the refresh period of the memory cell array of 1 M bits should be within 8 ms, the above mentioned refresh period 5.5 ms in this example is short enough to satisfy the above mentioned condition.

Assuming that the number of the refreshed rows of the memory array to be inserted between two adjacent transfer signals $\phi_{TF}$ is l, the refresh period of the memory cell array becomes 16.6 ms/l. Moreover, in case of l=1, if particularly there is defined a relation $m=n+j/2$ between the reading row address $R_n$ and the refresh row address $R_m$, it is possible to refresh all the memory cells in generally half a cycle, in other words, there is the same effect as in the case of l=2, reducing the consumption of the electric power.

According to the present invention, the refresh operation of the field memory array can be performed by the control signals used in the field memory array, therefore it is possible to perform the refresh operation of the memory cell array without any specific external refresh control units and external control signals so, that the number of the parts of the refresh system can be reduced and the design of the refresh system is simplified. Moreover, since the refresh period can be shortened by increasing the number of the refresh addresses, the period of the shift clock signal can be lengthened on the contrary so that the operating area of the memory can be expanded.

What is claimed is:

1. A field memory self-refresh system being completely integrated within a dynamic random access memory chip operating without reliance upon external control, comprising:
   control means for generating a read signal, write signal, an d transfer signal to control read and write operations,
   row address means for generating a first address to be utilized in one of a read and write operation in response to one of said read and write signal, and
   an integrated dynamic random access memory including,
      dynamic memory means for storing and outputting data according to said first address,
      refresh address means for generating a second address to be utilized in a refresh operation, said second address being distinct from said first address,
      selecting means for applying one of said first address and said second address to said dynamic memory means,
      latch means for latching data read from said dynamic memory means during a read operation, and
      output means for serially outputting data from said latch means in response to said transfer signal,
   said selecting means selecting said second address after said transfer signal is generated;
   said dynamic memory means having a portion thereof being refreshed according to said second address after said transfer signal is generated.

2. The self-refresh system as claimed in claim 1, wherein said dynamic memory means is a field memory array for storing image data for a television system.

3. The self-refresh system as claimed in claim 1, wherein said row address means is incremented in response to said transfer signals and said output means has transfer gates which transfer data from said latch means to an I/O line.

4. The self-refresh system as claimed in claim 3, wherein a refresh operation is performed a plurality of times between generation of said transfer signals.

* * * * *